United States Patent
Xie et al.

(10) Patent No.: US 10,917,089 B2
(45) Date of Patent: Feb. 9, 2021

(54) STACKED MOSFET CIRCUITS AND METHODS OF OPERATING STACKED MOSFET CIRCUITS

(71) Applicant: Astec International Limited, Kowloon (HK)

(72) Inventors: Yong Tao Xie, Daliang (CN); Ernesto Jr. Zaparita Caguioa, Baguio (PH)

(73) Assignee: Astec International Limited, Kowloon (HK)

( * ) Notice: Subject to any disclaimer, the term of this patent is extended or adjusted under 35 U.S.C. 154(b) by 0 days.

(21) Appl. No.: 15/948,384

(22) Filed: Apr. 9, 2018

(65) Prior Publication Data

US 2018/0302085 A1 Oct. 18, 2018

Related U.S. Application Data

(60) Provisional application No. 62/483,040, filed on Apr. 7, 2017.

(51) Int. Cl.
| | | |
|---|---|---|
| *H03K 17/687* | (2006.01) | |
| *H03K 17/693* | (2006.01) | |
| *H03K 17/06* | (2006.01) | |
| *H03K 17/567* | (2006.01) | |
| *H03K 17/13* | (2006.01) | |
| *H03K 17/10* | (2006.01) | |

(52) U.S. Cl.
CPC ......... *H03K 17/693* (2013.01); *H03K 17/063* (2013.01); *H03K 17/102* (2013.01); *H03K 17/133* (2013.01); *H03K 17/567* (2013.01); *H03K 17/6874* (2013.01); *H03K 2217/0081* (2013.01)

(58) Field of Classification Search
CPC .. H03K 17/693; H03K 17/063; H03K 17/102; H03K 17/133; H03K 17/567; H03K 17/6874; H03K 2217/0081
See application file for complete search history.

(56) References Cited

U.S. PATENT DOCUMENTS

| | | | |
|---|---|---|---|
| 4,487,458 A | 12/1984 | Janutka | |
| 7,307,406 B2* | 12/2007 | Shirai | H02M 3/1588 323/225 |
| 9,595,950 B1* | 3/2017 | Seok | H03K 17/102 |
| 2009/0189790 A1* | 7/2009 | Peterson | G06F 3/016 341/22 |

(Continued)

FOREIGN PATENT DOCUMENTS

CN  1286260 C  11/2006

*Primary Examiner* — Long Nguyen

(57) ABSTRACT

Example MOSFET circuits include a first metal-oxide-semiconductor field-effect transistor (MOSFET) having a gate, a source and a drain, and a second MOSFET coupled in series with the first MOSFET. The second MOSFET has a gate, a source and a drain. The MOSFET circuit also includes a controller configured to supply a same control signal to the gate of the first MOSFET and the gate of the second MOSFET to turn on or turn off the first MOSFET and the second MOSFET when a drain-source voltage of the first MOSFET and a drain-source voltage of the second MOSFET are substantially zero. Other MOSFET circuits and methods of operating MOSFET circuits are also disclosed.

26 Claims, 7 Drawing Sheets

(56) References Cited

U.S. PATENT DOCUMENTS

| | | | | |
|---|---|---|---|---|
| 2012/0293219 A1* | 11/2012 | Bai | ..................... | H02M 3/1588 |
| | | | | 327/109 |
| 2015/0042401 A1* | 2/2015 | Knol | ................ | H03K 17/04123 |
| | | | | 327/543 |
| 2015/0372590 A1* | 12/2015 | Seshita | ................... | H03K 5/08 |
| | | | | 327/536 |

* cited by examiner

STACKED MOSFET CIRCUITS AND METHODS OF OPERATING STACKED MOSFET CIRCUITS

CROSS-REFERENCE TO RELATED APPLICATION

This application claims the benefit and priority of U.S. Provisional Application No. 62/483,040 filed Apr. 7, 2017. The entire disclosure of the above application is incorporated herein by reference.

FIELD

The present disclosure relates to stacked MOSFET circuits and methods of operating stacked MOSFET circuits.

BACKGROUND

This section provides background information related to the present disclosure which is not necessarily prior art.

Multiple metal-oxide-semiconductor field-effect transistors (MOSFETs) can be connected in series, which is sometimes referred to as a "stacked" MOSFET configuration. These stacked MOSFET configurations typically use capacitive coupling to drive different MOSFETs in the stacked configuration. Specifically, charge variations on capacitors are used to obtain gate drive signals for the MOSFETs.

SUMMARY

This section provides a general summary of the disclosure, and is not a comprehensive disclosure of its full scope or all of its features.

According to one aspect of the present disclosure, a MOSFET circuit includes a first metal-oxide-semiconductor field-effect transistor (MOSFET) having a gate, a source and a drain, and a second MOSFET coupled in series with the first MOSFET. The second MOSFET includes a gate, a source and a drain. The MOSFET circuit also includes a controller configured to supply a control signal to the gate of the first MOSFET and the gate of the second MOSFET to turn on or turn off the first MOSFET and the second MOSFET when a drain-source voltage of the first MOSFET and a drain-source voltage of the second MOSFET are substantially zero.

According to another aspect of the present disclosure, a MOSFET circuit includes a first metal-oxide-semiconductor field-effect transistor (MOSFET) having a gate, a source and a drain. The stacked MOSFET circuit also includes a second MOSFET having a gate, a source and a drain. The second MOSFET is coupled in series with the first MOSFET. A voltage sharing circuit is coupled between the drain of the first MOSFET and the source of the second MOSFET. The voltage sharing circuit includes at least two series-connected resistors or at least two series-connected capacitors. The MOSFET circuit further includes a controller configured to supply a same control signal to the gate of the first MOSFET and the gate of the second MOSFET.

According to yet another aspect of the present disclosure, a method of operating a MOSFET circuit is disclosed. The stacked MOSFET circuit includes a first metal-oxide-semiconductor field-effect transistor (MOSFET) coupled in series with a second MOSFET. Each MOSFET includes a gate, a source and a drain. The method includes supplying a same gate drive signal to the gate of the first MOSFET and the gate of the second MOSFET to turn on or turn off the first MOSFET and the second MOSFET when a drain-source voltage of the first MOSFET and a drain-source voltage of the second MOSFET are substantially zero.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding features throughout the several views of the drawings.

DETAILED DESCRIPTION

Figure 1:
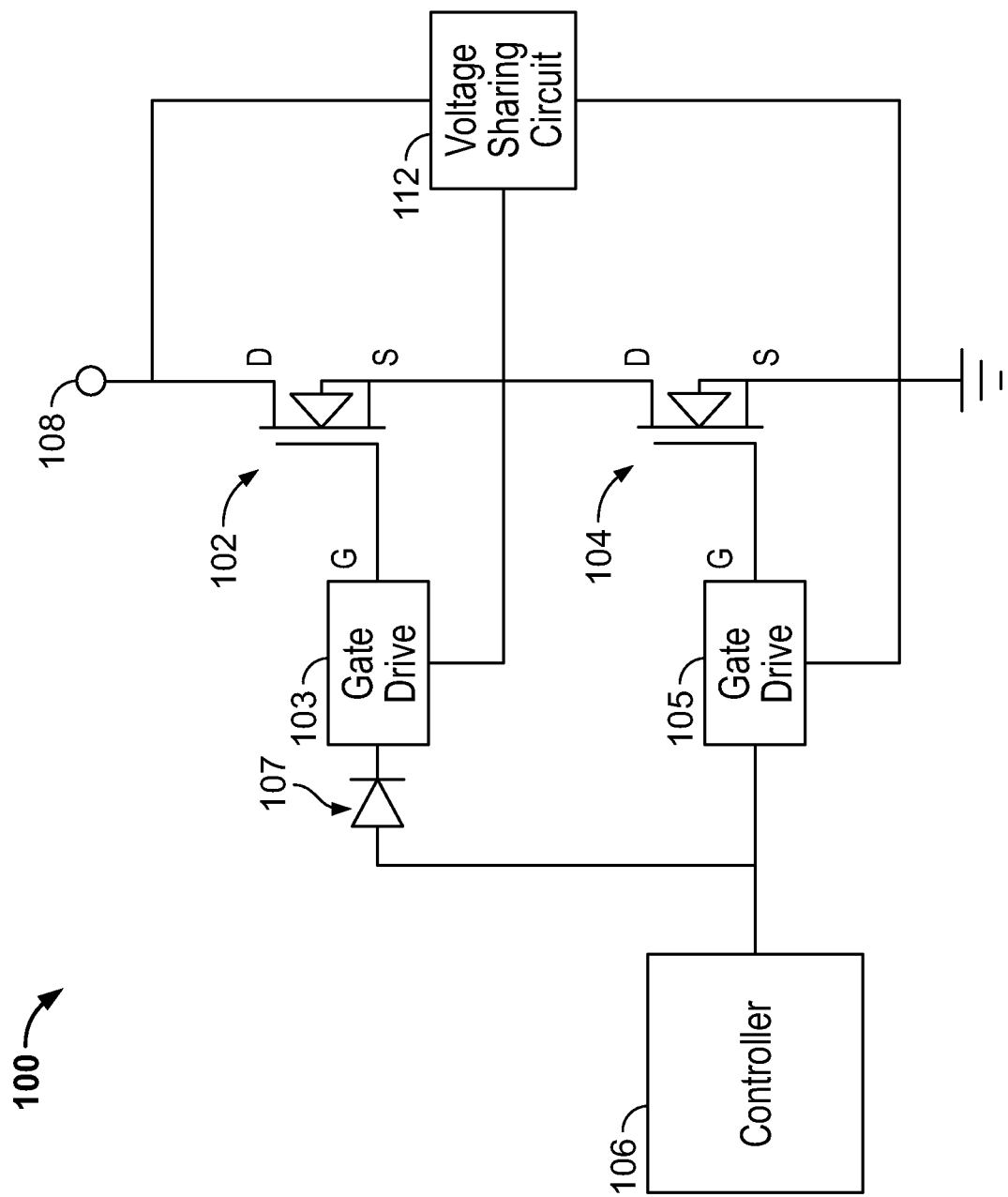
FIG. 1 is a circuit diagram of a MOSFET circuit according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A metal-oxide-semiconductor field-effect transistor (MOSFET) circuit according to one example embodiment of the present disclosure is illustrated in FIG. 1 and indicated generally by reference number 100. As shown in FIG. 1, the MOSFET circuit 100 includes a MOSFET 102 coupled in series with a MOSFET 104, which is sometimes referred to as a "stacked" MOSFET configuration. More specifically, each MOSFET 102 and 104 includes a gate (G), a source (S) and a drain (D), and the source of the MOSFET 102 is coupled with the drain of the MOSFET 104.

As shown in FIG. 1, the MOSFET circuit 100 may include an optional gate drive circuit 103 connected to the gate (G) of MOSFET 102, and an optional gate drive circuit 105 connected to the gate (G) of MOSFET 104. Each MOSFET 102 and 104 is controlled (e.g., driven) by its corresponding gate drive circuit 103, 105. Specifically, the gate drive circuit 103 provides a gate drive signal to the gate (G) of the MOSFET 102 (e.g., to turn on and turn off the MOSFET 102), and the gate drive circuit 105 provides a gate drive signal to the gate (G) of the MOSFET 104. The gate drive circuits 103 and 105 may include any suitable arrangement of resistor(s), diode(s), switch(es), etc. for providing the gate drive signals to the corresponding MOSFETs 102 and 104.

The MOSFET circuit 100 includes a controller 106. The controller is configured to supply the same control signal to the gate drive circuit 103 for the MOSFET 102, and to the gate drive circuit 105 for the MOSFET 104. The gate drive circuit 103 operates the MOSFET 102 in response to the control signal received from the controller 106, and the gate drive circuit 105 operates the MOSFET 104 in response the same control signal received from the controller 106. Therefore, the stacked MOSFET circuit 100 may be considered a "single driver" stacked MOSFET circuit.

As illustrated in FIG. 1, a diode 107 may be coupled between the controller 106 and the gate drive circuit 103 for the MOSFET 102. The diode 107 can inhibit (e.g. block, prevent, reduce) a reverse voltage propagating from the MOSFET 102 to the controller 106 when the MOSFET 102 is turned off. In this manner, the diode 107 can facilitate discharge of the MOSFET 102 and inhibit a reverse voltage propagating from the MOSFET 102 to the controller 106 during discharge.

The controller 106 may be configured to operate the MOSFET 102 and the MOSFET 104 with zero-voltage-switching (ZVS). This means the drain-source voltage of the MOSFET 102 is substantially zero when turning on or turning off the MOSFET 102, and the drain-source voltage of the MOSFET 104 is substantially zero when turning on or turning off the MOSFET 104.

For example, the control signal provided from controller 106 to the gate drive circuit 103 for the MOSFET 102 and the gate drive circuit 105 for the MOSFET 104 may turn on and/or turn off the MOSFET 102 and the MOSFET 104 only when the drain-source voltage of the MOSFET 102 and the drain-source voltage of the MOSFET 104 is substantially zero. The timing of the control signal to facilitate ZVS of the MOSFET 102 and the MOSFET 104 may be accomplished in any suitable manner, including sensing a drain-source voltage of each MOSFET 102 and 104. Alternatively, the timing of the control signal may be based on timing of operation of other switches (not shown) coupled with the MOSFET circuit 100, the timing of operation of other switches in a power supply (not shown) incorporating the MOSFET circuit 100, etc.

As shown in FIG. 1, the MOSFET 102 and the MOSFET 104 are coupled in series between a voltage node 108 and a reference potential (e.g., ground). In some embodiments, the voltage node 108 may be part of a voltage rail of a power supply (e.g., a switching power supply, such as a switched-mode power supply (SMPS), etc.). For example, the voltage node 108 may be part of a voltage rail on a secondary (e.g., output) side of the power supply. In those cases, the MOSFET 102 and the MOSFET 104 may be synchronous rectifiers of the power supply.

In some embodiments, the voltage node 108 may be part of a voltage rail on a primary (e.g., input) side of the power supply. In those cases, the MOSFET 102 and the MOSFET 104 can be main power switches of the power supply. In other embodiments, the MOSFET 102 and MOSFET 104 may be coupled between the voltage node 108 and a node other than ground, may be coupled between different portions of a power supply, may be coupled in circuits other than power supplies, etc.

As shown in FIG. 1, the MOSFET circuit 100 includes a voltage sharing (e.g., voltage balance) circuit 112. The voltage sharing circuit 112 is coupled between the drain (D) of the MOSFET 102 and the source (S) of the MOSFET 104, and allows the MOSFETs 102 and 104 to share a voltage of the voltage node 108. Therefore, the voltage across each individual MOSFET 102 and 104 is less than the voltage of voltage node 108.

As explained further below, the voltage sharing circuit 112 may include any suitable combination of resistor(s), capacitor(s), etc. for facilitating sharing (e.g., balancing) of the voltage across the MOSFET 102 and the MOSFET 104. For example, the voltage sharing circuit 112 may facilitate balancing of a drain (D) to source (S) voltage of the MOSFET 102 and a drain (D) to source (S) voltage of the MOSFET 104.

Because the MOSFET 102 and the MOSFET 104 each have only a portion of the voltage of voltage node 108, a breakdown voltage capacity of the series-connected MOSFET 102 and MOSFET 104 is increased (e.g., relative to a single MOSFET coupled between voltage node 108 and ground, etc.). For example, a breakdown voltage capacity of the series-connected MOSFET 102 and MOSFET 104 may be approximately double the breakdown voltage of a typical individual one of the MOSFET 102 and the MOSFET 104 (e.g., if only one of the MOSFET 102 and the MOSFET 104 were coupled between voltage node 108 and ground).

In some embodiments, a voltage across the MOSFET 102 may be approximately equal to a voltage across the MOSFET 104. For example, each MOSFET 102 and 104 may have about half of the voltage of voltage node 108. In other embodiments, the voltages across the MOSFET 102 and the MOSFET 104 may not be equal, with one of the MOSFET 102 and the MOSFET 104 having a greater voltage than the other one of the MOSFET 102 and the MOSFET 104.

Figure 2:
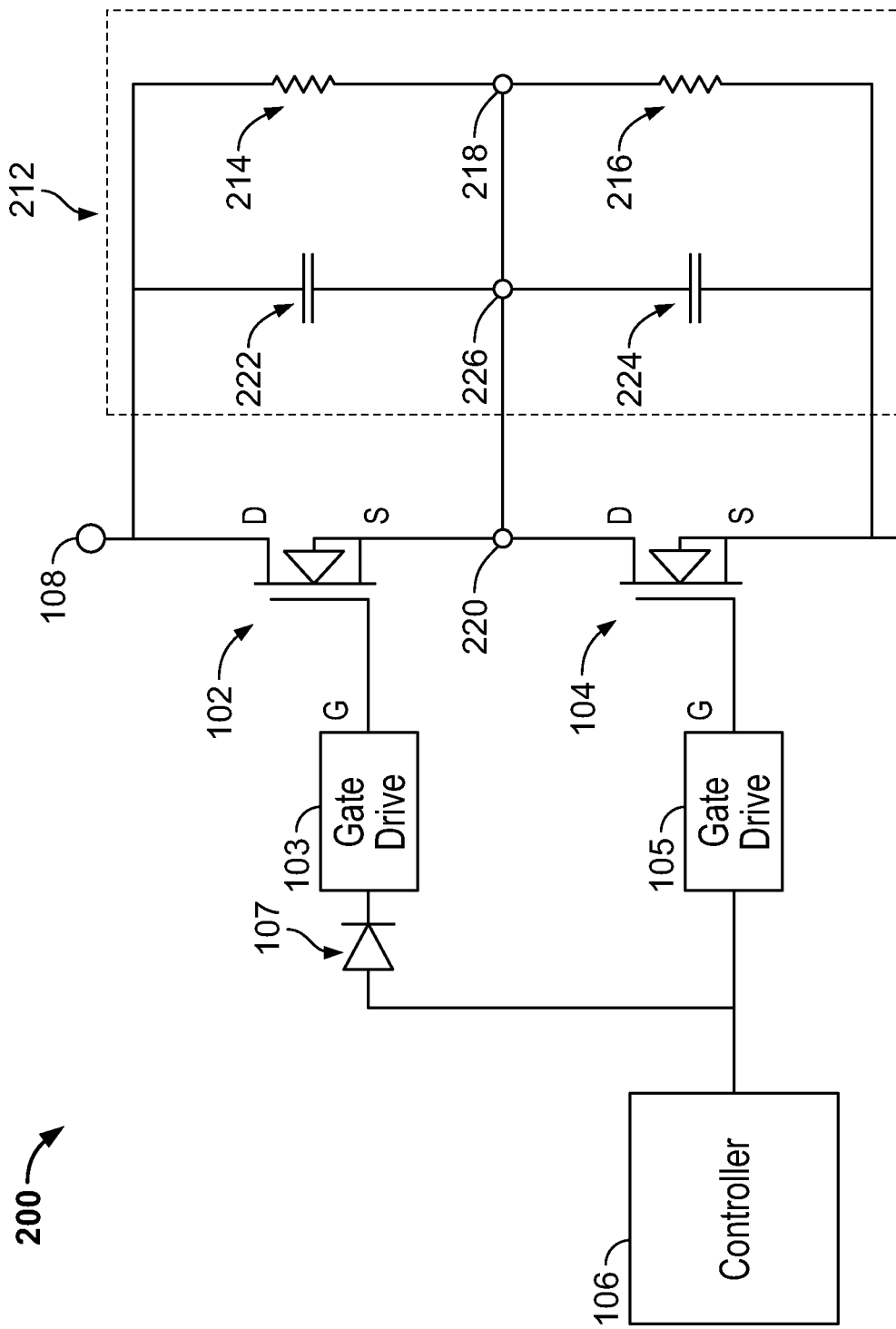
FIG. 2 is a circuit diagram of a MOSFET circuit including a voltage sharing circuit, according to another example embodiment of the present disclosure.

FIG. 2 illustrates a MOSFET circuit 200 according to another example embodiment of the present disclosure. As shown in FIG. 2, the voltage sharing circuit 212 includes a resistor 214 and a resistor 216 coupled in series between the drain (D) of the MOSFET 102 and the source (S) of the MOSFET 104. A node 218 located between the resistor 214 and the resistor 216 is coupled with a node 220 located between the MOSFET 102 and the MOSFET 104 (i.e., between the source (S) of MOSFET 102 and the drain (D) of MOSFET 104).

The voltage sharing circuit 212 also includes a capacitor 222 and a capacitor 224 coupled in series between the drain (D) of the MOSFET 102 and the source (S) of the MOSFET 104. A node 226 located between the capacitor 222 and the capacitor 224 is coupled with the node 220 located between the MOSFET 102 and the MOSFET 104.

The voltage sharing circuit 212 is arranged to facilitate voltage sharing (e.g., balanced voltage sharing) between the MOSFET 102 and the MOSFET 104. For example, the resistor 214 and the resistor 216 may provide static voltage balancing, etc. to assist the MOSFET 102 and the MOSFET 104 in sharing approximately equal voltages across the MOSFET 102 and the MOSFET 104 (e.g., so that each MOSFET 102 and 104 has about half of the voltage of the voltage node 108).

The capacitor 222 and the capacitor 224 may provide dynamic voltage balancing, etc. to assist the MOSFET 102 and the MOSFET 104 in sharing approximately equal voltages across the MOSFET 102 and the MOSFET 104 (e.g., so that each MOSFET 102 and 104 has about half of the voltage of the voltage node 108).

Although FIG. 2 illustrates the voltage sharing circuit 212 as including both the series-connected resistors 214 and 216 and the series-connected capacitors 222 and 224, other embodiments may include only one of (or none of) the series-connected resistors 214 and 216 and the series-connected capacitors 222 and 224. In some embodiments, the voltage sharing circuit 212 may include more than one set of series-connected resistors, more than one set of series-connected capacitors, etc. Further, the series-connected resistors may include more than two resistors connected in series, and the series-connected capacitors may include more than two capacitors coupled in series.

In addition, although FIG. 2 illustrates the series-connected resistors 214 and 216 and the series-connected capacitors 222 and 224 coupled between the drain (D) of the MOSFET 102 and the source (S) of the MOSFET 104, other embodiments may include different connection arrangements of the voltage sharing circuit 212. For example, if the drain (D) of the MOSFET 102 is coupled with the source (S) of the MOSFET 104 (opposite to the arrangement illustrated in FIG. 2), the series-connected resistors 214 and 216 and the series-connected capacitors 222 and 224 may be coupled between the source (S) of the MOSFET 102 and the drain (D) of the MOSFET 104.

As explained above, the source (S) of MOSFET 102 is coupled with the drain (D) of MOSFET 104 in FIG. 2. In other embodiments, the drain (D) of MOSFET 102 may be coupled with the source (S) of MOSFET 104, etc. Each MOSFET 102 and 104 may be a p-channel MOSFET, an n-channel MOSFET, etc. In some embodiments, the MOSFET 102 and the MOSFET 104 may be substantially identical.

The controller 106 may be configured to perform operations using any suitable combination of hardware and software. For example, the controller 106 can include any suitable circuitry, logic gates, microprocessor(s), computer-executable instructions stored in memory, etc. operable to cause the controller 106 to perform actions described herein (e.g., supplying the control signal to the MOSFET 102 and the MOSFET 104, etc.).

Figure 3:
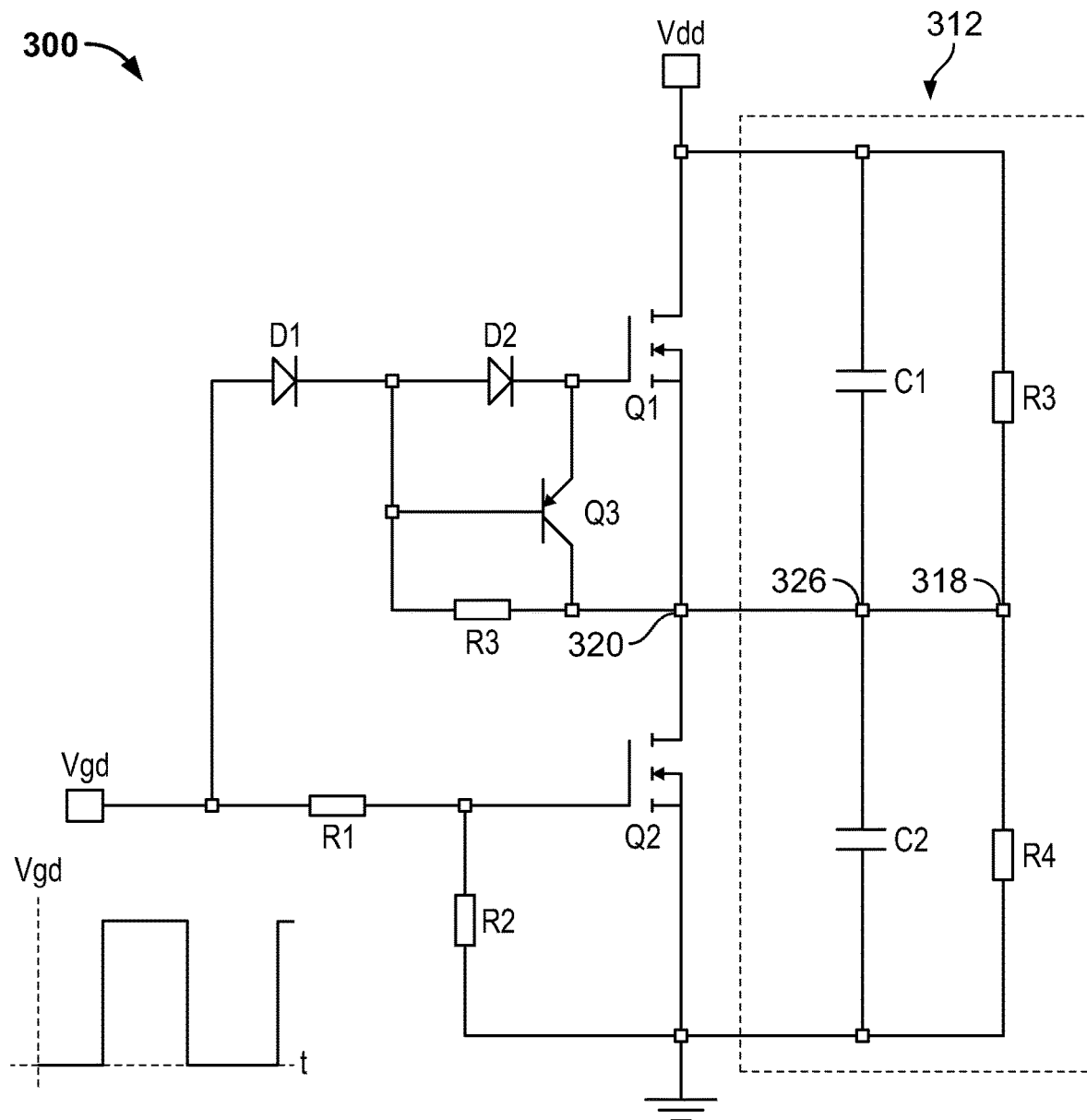
FIG. 3 is a circuit diagram of a MOSFET circuit according to another example embodiment of the present disclosure.

FIG. 3 illustrates another MOSFET circuit 300 according to another example embodiment of the present disclosure. As shown in FIG. 3, the MOSFET circuit 300 includes a MOSFET Q1 coupled in series with MOSFET Q2. The MOSFET Q1 and the MOSFET Q2 are coupled between a voltage node (Vdd) and ground.

A gate drive control signal (Vgd) is supplied by a controller (not shown) to the gate drive circuit for the MOSFET Q2. The same gate drive control signal (Vgd) is also supplied to the gate drive circuit for the MOSFET Q1. Therefore, the MOSFET circuit 300 may be considered as a "single driver stacked" MOSFET circuit.

A voltage sharing circuit 312 includes a resistor R3 coupled in series with a resistor R4 between the drain of the MOSFET Q1 and the source of the MOSFET Q2. The voltage sharing circuit 312 also includes a capacitor C1 coupled in series with a capacitor C2 between the drain of the MOSFET Q1 and the source of the MOSFET Q2.

A node 318 located between the resistor R3 and the resistor R4 is coupled with the node 320 located between the MOSFET Q1 and the MOSFET Q2. A node 326 located between the capacitor C1 and the capacitor C2 is coupled with the node 320 located between the MOSFET Q1 and the MOSFET Q2. The voltage sharing circuit 312 may assist MOSFET Q1 and MOSFET Q2 in maintaining shared (e.g., balanced) voltages across the MOSFET Q1 and the MOSFET Q2 (e.g., with each MOSFET Q1 and Q2 having about half of the voltage (Vdd)).

A switch Q3 is coupled between the gate of the MOSFET Q1 and the node 320 located between the MOSFET Q1 and the MOSFET Q2. The switch Q3 is coupled to receive the same gate drive signal (Vgd) that is supplied to the MOSFET Q1 and the MOSFET Q2, to inhibit the MOSFET Q1 from turning on while the gate drive signal (Vgd) is at a logical low value.

In the case where the voltage node (Vdd) is part of a voltage rail on a secondary output side of a power supply, the MOSFETs Q1 and Q2 may operate as synchronous rectifiers with ZVS. When the voltage node (Vdd) becomes low, current will flow through body diodes of the MOSFETs Q1 and Q2 before the MOSFETs Q1 and Q2 are initially turned on.

The MOSFETs Q1 and Q2 can be substantially simultaneously turned off before, during, or after the voltage node (Vdd) reverses voltage (e.g., due to a next cycle/phase of the switched-mode power supply) according to a specified timing requirement, according to sensed voltage signals, etc.

The voltage sharing circuit 312 may facilitate voltage sharing (e.g., balanced voltage sharing) between the MOSFET Q1 and the MOSFET Q2 during a turn-on state of the MOSFETs Q1 and Q2, during a turn-off state of the MOSFETs Q1 and Q2, during an off state of the MOSFETs Q1 and Q2, etc.

A diode D1 inhibits (e.g., blocks, prevents, reduces) a reverse high voltage propagating from the MOSFET Q1 to the gate drive signal node (Vgd) when the MOSFET Q1 is off. The switch Q3 and a resistor R3 coupled with the switch Q3 form a fast turn off circuit for the MOSFET Q1.

As shown in FIG. 3, the gate drive control signal (Vgd) may be a pulse width modulated (PWM) signal having a series of high and low voltage values to turn on and turn off the MOSFET Q1 and the MOSFET Q2. However, other embodiments may include gate drive signals (Vgd) having forms other than PWM square waves.

In some embodiments, the MOSFET circuits may not include any capacitive coupling to drive one or more of the MOSFETs. For example, the MOSFET circuits may not use charge variations on capacitors coupled with gates of the MOSFETs to drive the MOSFETs. In applications where body diode conduction of the MOSFETs is allowed, capacitive coupling may not function properly when the body diode conducts (e.g., when the drain to source voltage is substantially zero, etc.). This body diode conduction may mis-trigger charging and/or discharging of the capacitor such that the MOSFET is turned on and/or off unexpectedly.

Figure 4:
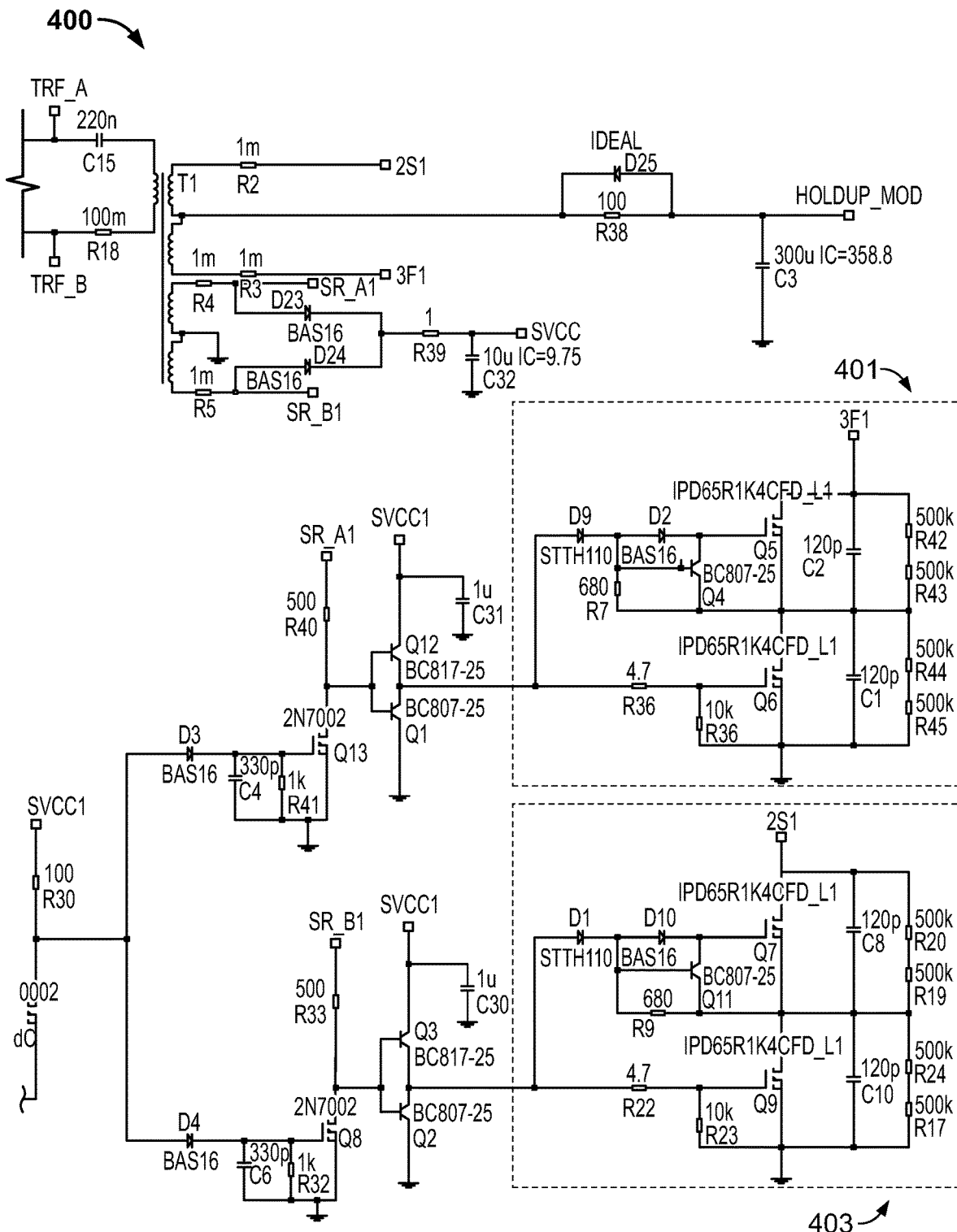
FIG. 4 is a circuit diagram of a switched-mode power supply including two MOSFET circuits, according to another example embodiment of the present disclosure.

FIG. 4 illustrates a switched-mode power supply 400, which includes two MOSFET circuits 401 and 403. The MOSFET circuits 401 and 403 may be similar to the MOSFET circuits 100, 200, 300 described above.

As shown in FIG. 4, the MOSFET circuit 401 is coupled with one voltage rail on a secondary output side of the power supply 400. In this case, the MOSFET circuit 401 operates as a synchronous rectifier for the voltage rail of the power supply 400.

The stacked MOSFET circuit 403 is coupled with the other voltage rail (i.e., different from the voltage rail coupled with the stacked MOSFET circuit 401) on the secondary output side of the power supply 400. In this case, the MOSFET circuit 403 operates as a synchronous rectifier for the other voltage rail of the power supply 400.

Although FIG. 4 illustrates the MOSFET circuit 401 and the MOSFET circuit 403 operating as synchronous rectifiers for power supply 400, in other embodiments the MOSFET circuit 401 and the MOSFET circuit 403 could be coupled with voltage rails on a primary input side of the power supply 400 to operate as main power switches, etc.

Figure 5A:
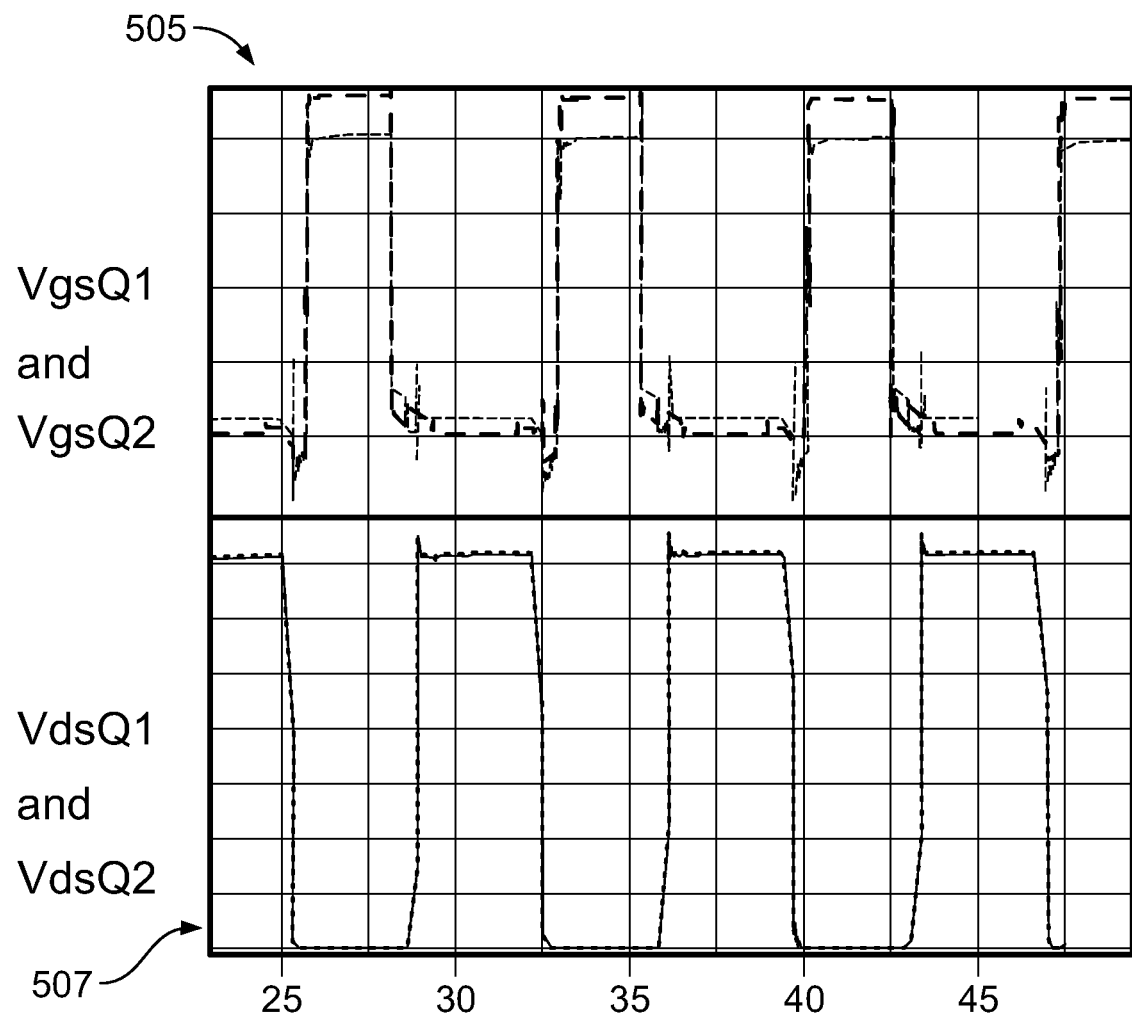
FIG. 5A is a line graph of example simulated voltage waveforms of the MOSFET circuit of FIG. 3.

FIG. 5A illustrates simulated voltage waveforms of the MOSFET Q1 and the MOSFET Q2 of the MOSFET circuit 300 illustrated in FIG. 3. The upper traces 505 of FIG. 5A illustrate gate-source voltages of the MOSFET Q1 and the MOSFET Q2 during multiple turn on and turn off events of the MOSFETS Q1 and Q2. The lower traces 507 of FIG. 5A illustrate drain-source voltages of the MOSFET Q1 and the MOSFET Q2 during the multiple turn on and turn off events of the MOSFETS Q1 and Q2.

Figure 5B:
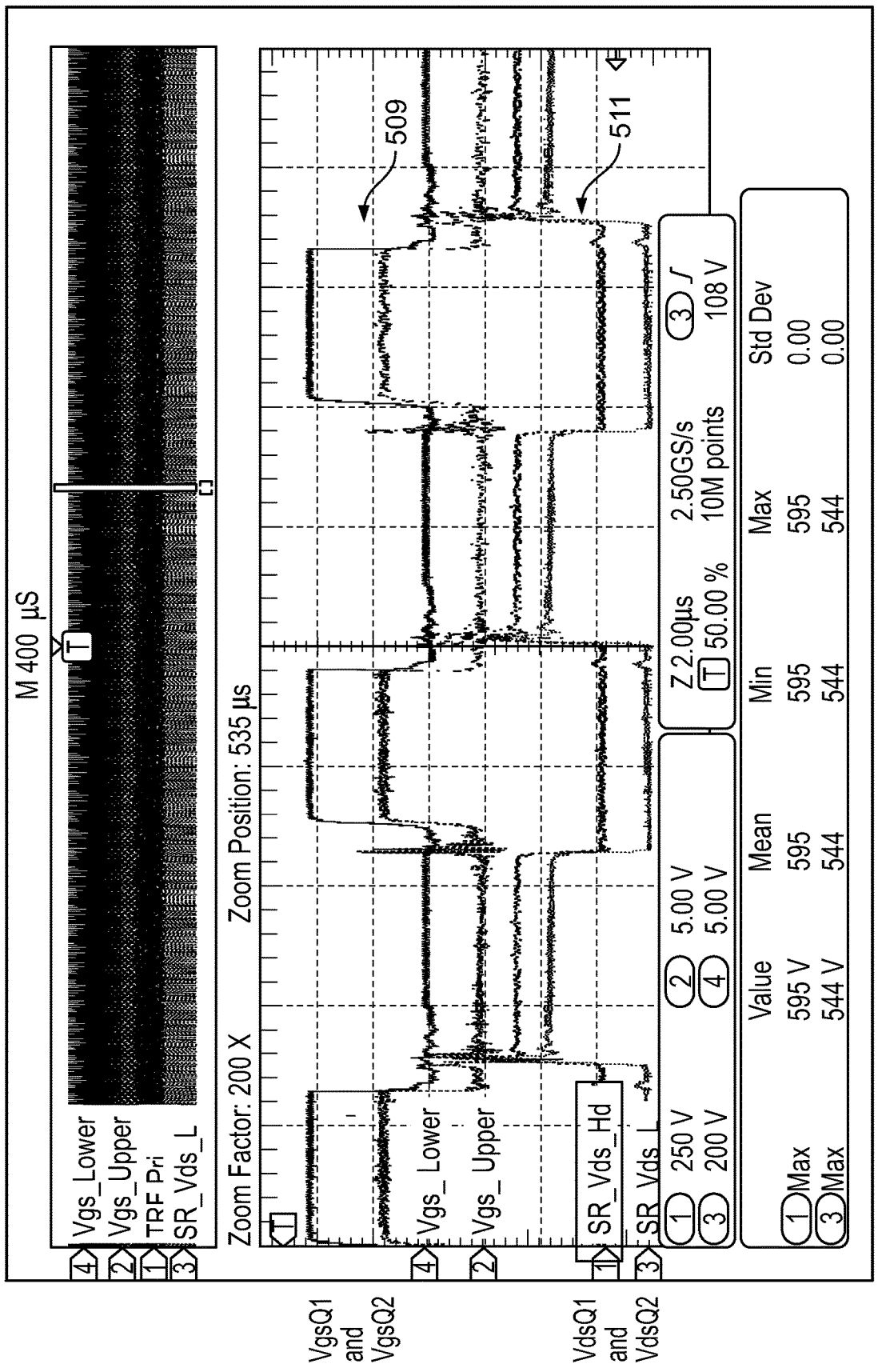
FIG. 5B is a line graph of example measured voltage waveforms of the MOSFET circuit of FIG. 3.

FIG. 5B illustrates measured voltage waveforms of the MOSFET Q1 and the MOSFET Q2 of the MOSFET circuit 300 illustrated in FIG. 3 during operation of the stacked MOSFET circuit 300. The upper traces 509 of FIG. 5B illustrate gate-source voltages of the MOSFET Q1 and the MOSFET Q2 during multiple turn on and turn off events of the MOSFETS Q1 and Q2. The lower traces 511 of FIG. 5B illustrate drain-source voltages of the MOSFET Q1 and the MOSFET Q2 during the multiple turn on and turn off events of the MOSFETs Q1 and Q2.

Figure 6:
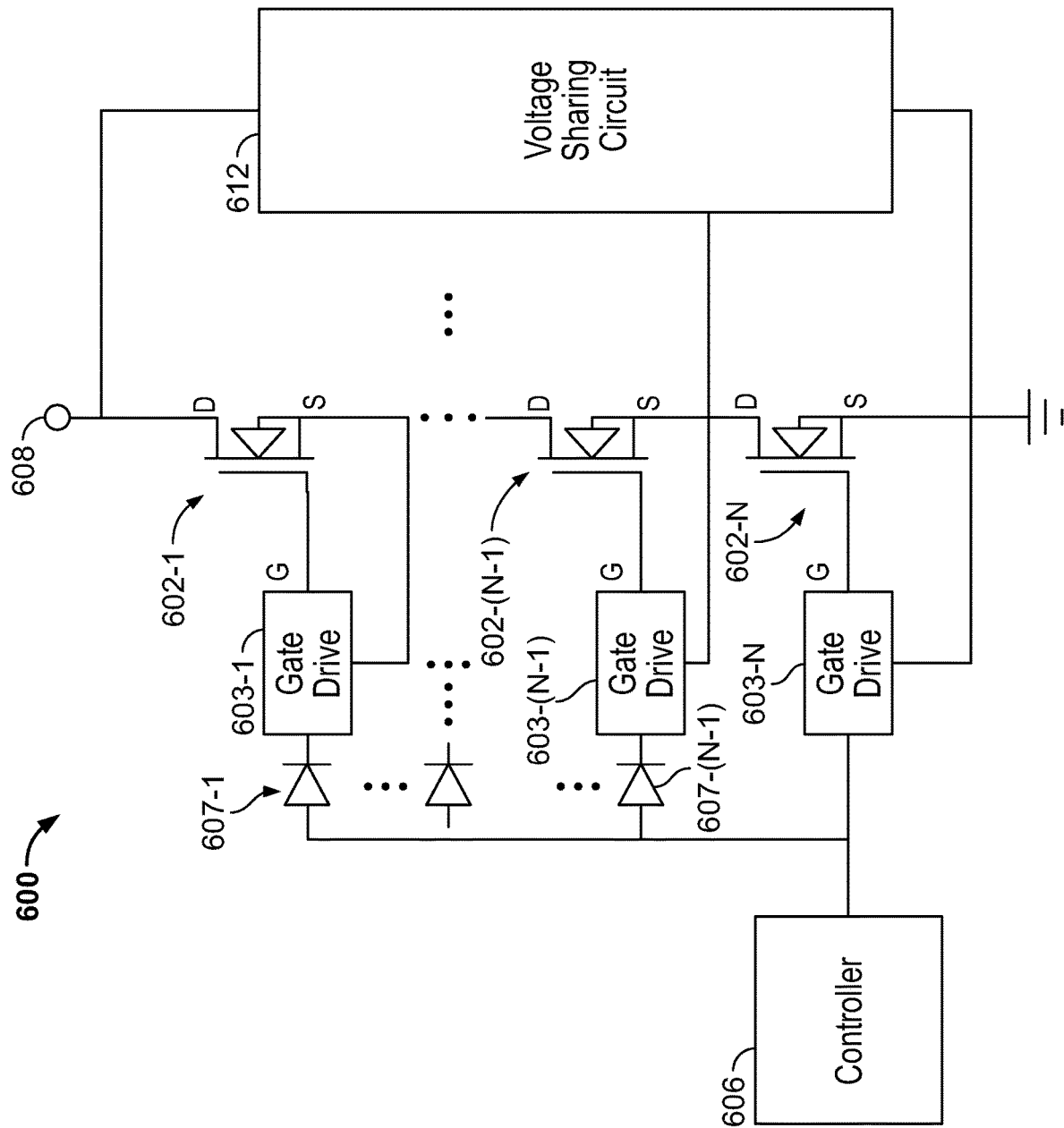
FIG. 6 is a circuit diagram of a MOSFET circuit having more than two MOSFET switches, according to another example embodiment of the present disclosure.

FIG. 6 illustrates a MOSFET circuit 600 including multiple MOSFETs 602-1 through 602-N, according to another example embodiment of the present disclosure. Similar to other example MOSFET circuits described herein, the multiple MOSFETs 602-1 through 602-N are coupled in series (i.e., between a voltage node 608 and a reference potential).

The MOSFET circuit 600 includes multiple gate drive circuits 603-1 through 603-N. Each of the multiple gate drive circuits provides a control signal to a corresponding one of the multiple MOSFETs 602-1 through 602-N.

A controller 606 provides a same control signal to each gate drive circuit 603-1 through 603-N. Each gate drive circuit 603-1 through 603-N then operates its corresponding one of the MOSFETs 602-1 through 602-N in response to the control signal received from controller 606.

The MOSFET circuit 600 also includes multiple diodes 607-1 through 607-(N−1). Each diode 607-1 through 607-(N−1) is coupled between the controller 606 and a corresponding one of the gate drive circuits 603-1 through 603-(N−1), to facilitate discharge of its corresponding MOSFET 602-1 through 602-(N−1).

A voltage sharing circuit 612 is coupled between the drain (D) of MOSFET 602-1 and the source (S) of MOSFET 602-N. The voltage sharing circuit 612 may assist in facilitating approximately equal voltage sharing between the MOSFETs 602-1 through 602-N.

As described above, the MOSFET circuit 600 includes multiple MOSFETs 602-1 through 602-N coupled in series, which can be driven by a same control signal from controller 606. Although the MOSFET circuit 600 illustrates three MOSFETs, other embodiments may include more than three MOSFETs (e.g., four MOSFETs, five MOSFETs, etc.).

The MOSFET circuits described herein may be used in any suitable application, including as main power switches, synchronous rectifiers, etc. of a switched-mode power supply (SMPS). The MOSFET circuits could be used in applications where body diode conduction is allowed for a certain time before fully turning-on a MOSFET channel.

In another example embodiment, a method of operating a MOSFET circuit is disclosed. The MOSFET circuit includes a first metal-oxide-semiconductor field-effect transistor (MOSFET) coupled in series with a second MOSFET. Each MOSFET includes a gate, a source and a drain. Each MOSFET may have a gate drive circuit coupled with the gate of the MOSFET, and may include a diode coupled between the gate drive circuit and a controller of the stacked MOSFET circuit. A voltage sharing circuit may be coupled between the MOSFETs.

The method includes supplying a same gate drive signal to the gate of the first MOSFET and the gate of the second MOSFET to operate the first MOSFET and the second MOSFET with zero-voltage-switching (ZVS) where a drain-source voltage of the first MOSFET and a drain-source voltage of the second MOSFET are substantially zero when turning on or turning off the first MOSFET and the second MOSFET.

In some embodiments, the MOSFET circuit may include a voltage sharing circuit coupled between the drain of the first MOSFET and the source of the second MOSFET to facilitate voltage sharing (e.g., balanced voltage sharing) between the first MOSFET and the second MOSFET. In those cases, the voltage sharing circuit may include at least two series-connected resistors and/or at least two series connected capacitors. The series-connected resistors may provide a static voltage balancing network, and the series-connected capacitors may provide a dynamic voltage balancing network.

In some embodiments, the MOSFET circuit may include a switch coupled between the gate drive circuit of the first MOSFET and a node located between the first MOSFET and the second MOSFET. In those cases, the method may further include supplying the gate drive signal to the switch to inhibit the first MOSFET from turning on while the gate drive signal is low. In some embodiments, supplying the gate drive circuit to the first MOSFET and supplying the gate drive circuit to the second MOSFET may include supplying the gate drive signal to control the first MOSFET and the second MOSFET so a voltage across the first MOSFET is substantially the same as a voltage across the second MOSFET during a turn-on state, a turn-off state, an off state, etc.

Any of the example embodiments and aspects disclosed herein may be used in any suitable combination with any other example embodiments and aspects disclosed herein without departing from the scope of the present disclosure. For example, MOSFET circuits described herein may implement other operation methods, the operation methods described herein may be implemented in other MOSFET configurations, etc. without departing from the scope of the present disclosure.

Example embodiments and aspects of the present disclosure may provide any one or more (or none) of the following advantages: reduced parts count, reduced cost, reduced circuit complexity, increased timing control precision, enhanced voltage sharing between the MOSFETs, increased breakdown voltage capacity of the series-connected MOSFETs, reduced leading edge voltage spikes at MOSFET turn off, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A MOSFET circuit comprising:
a first metal-oxide-semiconductor field-effect transistor (MOSFET) having a gate, a source and a drain;
a second MOSFET coupled in series with the first MOSFET, the second MOSFET having a gate, a source and a drain; and
a controller configured to supply a same control signal to the gate of the first MOSFET and the gate of the second MOSFET to turn on the first MOSFET and the second MOSFET when a drain-source voltage of the first MOSFET and a drain-source voltage of the second MOSFET are substantially zero prior to turn on, wherein the first MOSFET and the second MOSFET are turned on at the same time.

2. The MOSFET circuit of claim 1, further comprising a power supply having a voltage rail and a reference potential, wherein the first MOSFET and the second MOSFET are coupled between the voltage rail and the reference potential.

3. The MOSFET circuit of claim 2, wherein the first MOSFET and the second MOSFET are coupled to share a voltage of the voltage rail with the voltage across each MOSFET less than the voltage of the voltage rail.

4. The MOSFET circuit of claim 1, wherein the first MOSFET and the second MOSFET are coupled with the voltage across the first MOSFET substantially equal to the voltage across the second MOSFET.

5. The MOSFET circuit of claim 1, further comprising:
a node located between the first MOSFET and the second MOSFET; and
a switch coupled between the gate of the first MOSFET and the node.

6. The MOSFET circuit of claim 5, wherein the switch is controlled by the control signal to inhibit the first MOSFET from turning on while the control signal is at a logical low value.

7. The MOSFET circuit of claim 1, further comprising a voltage sharing circuit coupled between the first MOSFET and the second MOSFET.

8. The MOSFET circuit of claim 7, wherein the voltage sharing circuit includes a first resistor and a second resistor coupled in series with the first resistor, the first and second resistor positioned between the drain of the first MOSFET and the source of the second MOSFET.

9. The MOSFET circuit of claim 8, wherein a node located between the first resistor and the second resistor is coupled with a node located between the first MOSFET and the second MOSFET.

10. The MOSFET circuit of claim 7, wherein the voltage sharing circuit includes a first capacitor and a second capacitor coupled in series with the first capacitor, the first and second capacitors positioned between the drain of the first MOSFET and the source of the second MOSFET.

11. The MOSFET circuit of claim 10, wherein a node located between the first capacitor and the second capacitor is coupled with a node located between the first MOSFET and the second MOSFET.

12. The MOSFET circuit of claim 1, further comprising:
a first gate drive circuit coupled between the controller and the gate of the first MOSFET to receive the control signal from the controller and operate the first MOSFET in response to the received control signal; and
a second gate drive circuit coupled between the controller and the gate of the second MOSFET to receive the control signal from the controller and operate the second MOSFET in response to the received control signal.

13. The MOSFET circuit of claim 1, further comprising a diode having a cathode and an anode, the cathode coupled with the first MOSFET and the anode coupled with the controller.

14. A MOSFET circuit comprising:
a first metal-oxide-semiconductor field-effect transistor (MOSFET) having a gate, a source and a drain;
a second MOSFET having a gate, a source and a drain, the second MOSFET coupled in series with the first MOSFET;
a voltage sharing circuit coupled between the drain of the first MOSFET and the source of the second MOSFET, the voltage sharing circuit including at least two series-connected resistors or at least two series-connected capacitors;
a node located between the first MOSFET and the second MOSFET;
a transistor having a base, a collector and an emitter, the collector coupled to the gate of the first MOSFET and the emitter coupled to the node; and a controller configured to supply a same control signal to the gate of the first MOSFET and the gate of the second MOSFET to turn on the first MOSFET and the second MOSFET at the same time, and supply the same control signal to the base of the transistor to form a fast turn off circuit for the first MOSFET.

15. The MOSFET circuit of claim 14, wherein:
the voltage sharing circuit comprises the at least two series-connected resistors; and
a node located between the at least two series-connected resistors is coupled with the node located between the first MOSFET and the second MOSFET.

16. The MOSFET circuit of claim 14, wherein:
the voltage sharing circuit comprises the at least two series-connected capacitors; and
a node located between the at least two series-connected capacitors is coupled with the node located between the first MOSFET and the second MOSFET.

17. The MOSFET circuit of claim 14, wherein the first MOSFET and the second MOSFET are coupled with the voltage across the first MOSFET substantially equal to the voltage across the second MOSFET.

18. The MOSFET circuit of claim 14, wherein the transistor is controlled by the control signal to inhibit the first MOSFET from turning on while the control signal is a logical low value.

19. The MOSFET circuit of claim 14, further comprising a diode having a cathode and an anode, the cathode coupled with first MOSFET and the anode coupled with the controller.

20. The MOSFET circuit of claim 14, further comprising:
a first gate drive circuit coupled between the controller and the gate of the first MOSFET to receive the control signal from the controller and operate the first MOSFET in response to the received control signal; and
a second gate drive circuit coupled between the controller and the gate of the second MOSFET to receive the control signal from the controller and operate the second MOSFET in response to the received control signal.

21. A method of operating a MOSFET circuit including a first metal-oxide-semiconductor field-effect transistor (MOSFET) coupled in series with a second MOSFET, each MOSFET having a gate, a source and a drain, the method comprising:
supplying a same gate drive signal to the gate of the first MOSFET and the gate of the second MOSFET to turn on the first MOSFET and the second MOSFET when a drain-source voltage of the first MOSFET and a drain-source voltage of the second MOSFET are substantially zero prior to turn on, wherein the first MOSFET and the second MOSFET are turned on at the same time.

22. The method of claim 21, wherein:
the MOSFET circuit includes a voltage sharing circuit coupled between the drain of the first MOSFET and the source of the second MOSFET; and
the voltage sharing circuit includes at least two series-connected resistors or at least two series-connected capacitors.

23. The method of claim 21, wherein supplying the gate drive signal to the first MOSFET and supplying the gate drive signal to the second MOSFET includes supplying the gate drive signal to control the first MOSFET and the second MOSFET with a voltage across the first MOSFET substantially the same as a voltage across the second MOSFET.

24. The method of claim 21 wherein the MOSFET circuit further includes a switch coupled between the gate of the first MOSFET and a node located between the first MOSFET and the second MOSFET, the method further comprising:
supplying the gate drive signal to the switch to inhibit the first MOSFET from turning on while the gate drive signal is a logical low value.

25. A power supply including:
a main power switch comprising the MOSFET circuit of claim 1; or
a synchronous rectifier comprising the MOSFET circuit of claim 1.

26. A MOSFET circuit comprising:
a first metal-oxide-semiconductor field-effect transistor (MOSFET) having a gate, a source and a drain;
a second MOSFET having a gate, a source and a drain, the second MOSFET coupled in series with the first MOSFET;
a voltage sharing circuit coupled between the drain of the first MOSFET and the source of the second MOSFET, the voltage sharing circuit including at least two series-connected resistors or at least two series-connected capacitors;
a node located between the first MOSFET and the second MOSFET;
a transistor coupled between the gate of the first MOSFET and the node;
a controller configured to supply a same control signal to the gate of the first MOSFET and the gate of the second MOSFET to turn on the first MOSFET and the second MOSFET at the same time; and
a diode having a cathode and an anode, the cathode coupled with first MOSFET and the anode coupled with the controller.

* * * * *